(12) United States Patent
Parkinson et al.

(10) Patent No.: US 6,990,017 B1
(45) Date of Patent: Jan. 24, 2006

(54) ACCESSING PHASE CHANGE MEMORIES

(75) Inventors: Ward D. Parkinson, Boise, ID (US); Charles H. Dennison, San Jose, CA (US); Stephen Hudgens, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 23 days.

(21) Appl. No.: 10/882,860

(22) Filed: Jun. 30, 2004

(51) Int. Cl.
*H01L 21/336* (2006.01)

(52) U.S. Cl. ............. 365/185.05; 365/63; 365/185.07; 365/185.24; 257/42

(58) Field of Classification Search ........... 365/185.05, 365/185.07, 63; 257/42
See application file for complete search history.

(56) References Cited

U.S. PATENT DOCUMENTS

| | | | |
|---|---|---|---|
| 5,414,271 A * | 5/1995 | Ovshinsky et al. ............ | 257/3 |
| 6,072,454 A * | 6/2000 | Nakai et al. .................. | 345/97 |
| 6,147,900 A * | 11/2000 | Pohm ......................... | 365/158 |
| 6,349,053 B1 * | 2/2002 | Daughton et al. ........... | 365/145 |
| 6,750,101 B2 * | 6/2004 | Lung .......................... | 438/257 |
| 6,862,226 B2 * | 3/2005 | Toyoda et al. ......... | 365/189.07 |

OTHER PUBLICATIONS

Van Landingham, "Circuit Applications of Ovonic Switching Devices", IEEE Transactions on Electron Devices, vol. ED-20, No. 2, Feb. 1973.

* cited by examiner

*Primary Examiner*—Viet Q. Nguyen
(74) *Attorney, Agent, or Firm*—Trop, Pruner & Hu, P.C.

(57) ABSTRACT

A memory may include a phase change memory element and series connected first and second selection devices. The second selection device may have a higher resistance and a larger threshold voltage than the first selection device. In one embodiment, the first selection device may have a threshold voltage substantially equal to its holding voltage. In some embodiments, the selection devices and the memory element may be made of chalcogenide. In some embodiments, the selection devices may be made of non-programmable chalcogenide. The selection device with the higher threshold voltage may contribute lower leakage to the combination, but may also exhibit increased snapback. This increased snapback may be counteracted by the selection device with the lower threshold voltage, resulting in a combination with low leakage and high performance in some embodiments.

26 Claims, 3 Drawing Sheets

ACCESSING PHASE CHANGE MEMORIES

BACKGROUND

This invention relates generally to phase change memory devices.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials are also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

A transistor or a diode may be connected to the phase change material and may serve as a select device to access the phase change material during programming or read operations. The transistor or diode is typically formed in or on the top surface of a silicon single crystal substrate. Transistors may take up a relatively large portion of the memory chip, and therefore may increase the memory cell size, thereby adversely affecting the memory capacity and cost/bit of a memory chip.

DETAILED DESCRIPTION

Figure 1:
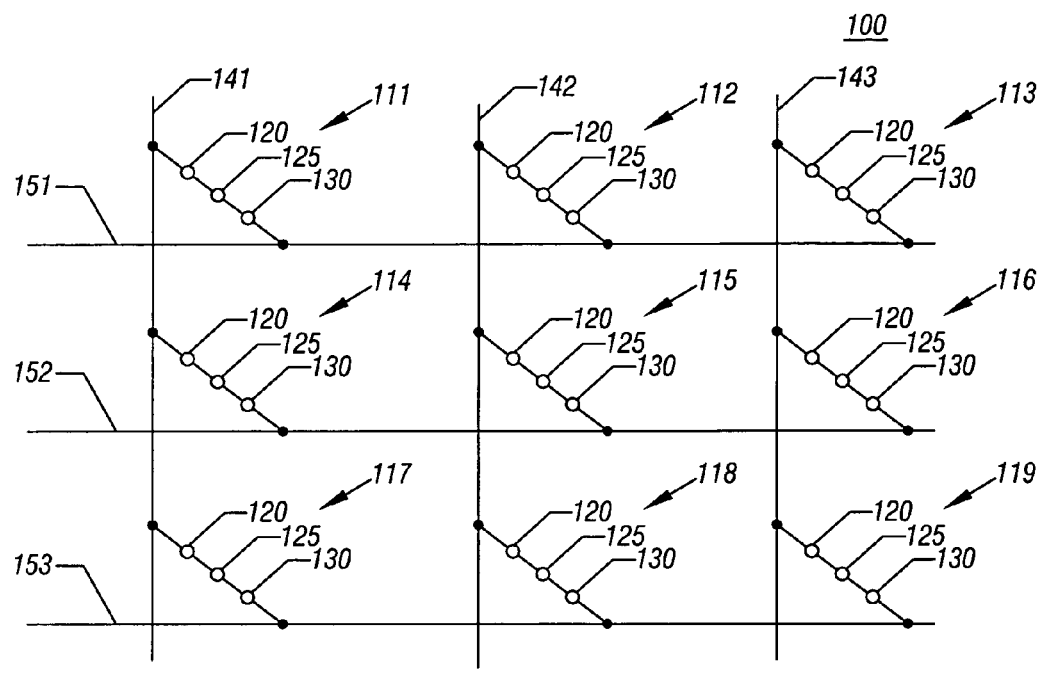
FIG. 1 is a schematic diagram illustrating a memory in accordance with one embodiment of the present invention.

Turning to FIG. 1, an embodiment of a memory 100 is illustrated. Memory 100 may include a 3×3 array of memory cells 111–119, wherein memory cells 111–119 each include a select device 120, a select device 125, and a memory element 130. Although a 3×3 array is illustrated in FIG. 1, the scope of the present invention is not limited in this respect. Memory 100 may have a larger array of memory cells.

In one embodiment, memory elements 130 may comprise a phase change material. In this embodiment, memory 100 may be referred to as a phase change memory. A phase change material may be a material having electrical properties (e.g. resistance, capacitance, etc.) that may be changed through the application of energy such as, for example, heat, light, voltage potential, or electrical current. Examples of a phase change material may include a chalcogenide material.

A chalcogenide alloy may be used in a memory element or in an electronic switch. A chalcogenide material may be a material that includes at least one element from column VI of the periodic table or may be a material that includes one or more of the chalcogen elements, e.g., any of the elements of tellurium, sulfur, or selenium.

Memory 100 may include column lines 141–143 and row lines 151–153 to select a particular memory cell of the array during a write or read operation. Column lines 141–143 and row lines 151–153 may also be referred to as address lines since these lines may be used to address memory cells 111–119 during programming or reading. Column lines 141–143 may also be referred to as bit lines and row lines 151–153 may also be referred to as word lines.

Memory elements 130 may be connected to row lines 151–153 and may be coupled to column lines 141–143 via select devices 120, 125. While two devices 120, 125 are depicted, more select devices may also be used. Therefore, when a particular memory cell (e.g., memory cell 115) is selected, voltage potentials may be applied to the memory cell's associated column line (e.g., 142) and row line (e.g., 152) to apply a voltage potential across the memory cell.

Series connected select devices 120 and 125 may be used to access memory element 130 during programming or reading of memory element 130. A select device is an ovonic threshold switch that can be made of a chalcogenide alloy that does not exhibit an amorphous to crystalline phase change and which undergoes rapid, electric field initiated change in electrical conductivity that persists only so long as a holding voltage is present. Select devices 120, 125 may operate as a switch that is either "off" or "on" depending on the amount of voltage potential applied across the memory cell, and more particularly whether the current through the select device exceeds its threshold current or voltage, which then triggers the device into the on state. The off state may be a substantially electrically nonconductive state and the on state may be a substantially conductive state, with less resistance than the off state. In the on state, the voltage across the select device is equal to its holding voltage $V_H$ plus IxRon, where Ron is the dynamic resistance from $V_H$. For example, select devices 120, 125 may have threshold voltages and, if a voltage potential less than the threshold voltage of a select device 120, 125 is applied across select devices 120, 125, then at least one select device 120 or 125 may remain "off" or in a relatively high resistive state so that little or no electrical current passes through the memory cell and most of the voltage drop from selected row to selected column is across the select device. Alternatively, if a voltage potential greater than the threshold voltages of select devices 120, 125 is applied across select devices 120, 125, then both select devices 120, 125 may "turn on," i.e., operate in a relatively low resistive state so that electrical current passes through the memory cell. In other words, select devices 120, 125 may be in a substantially electrically nonconductive state if less than a predetermined voltage potential, e.g., the threshold voltage, is applied across select devices 120, 125. Select devices 120, 125 may be in a substantially conductive state if greater than the predetermined voltage potential is applied across select devices 120, 125. Select devices 120, 125 may also be referred to as an access device, an isolation device, or a switch.

In one embodiment, each select device 120, 125 may comprise a switching material such as, for example, a chalcogenide alloy, and may be referred to as an ovonic threshold switch, or simply an ovonic switch. The switching material of select devices 120, 125 may be a material in a substantially amorphous state positioned between two electrodes that may be repeatedly and reversibly switched between a higher resistance "off" state (e.g., greater than about ten megaOhms) and a relatively lower resistance "on" state (e.g., about one thousand Ohms in series with $V_H$) by application of a predetermined electrical current or voltage potential. In this embodiment, each select device 120, 125 may be a two terminal device that may have a current-voltage (I-V) characteristic similar to a phase change memory element that is in the amorphous state. However, unlike a phase change memory element, the switching material of select devices 120, 125 may not change phase. That is, the switching material of select devices 120, 125 may not be a programmable material, and, as a result, select devices 120, 125 may not be a memory device capable of storing information. For example, the switching material of select devices 120, 125 may remain permanently amorphous and the I-V characteristic may remain the same throughout the operating life. A representative example of I-V characteristics of select devices 120, 125 is shown in FIGS. 2 and 3.

Figure 2:
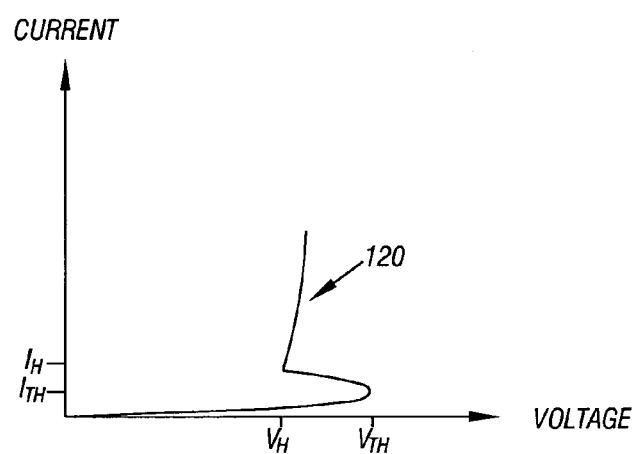
FIG. 2 is a diagram illustrating a current-voltage characteristic of an access device.

Turning to FIG. 2, in the low voltage or low electric field mode, i.e., where the voltage applied across select device 120 is less than a threshold voltage (labeled $V_{TH}$), select device 120 may be "off" or nonconducting, and exhibit a relatively high resistance, e.g., greater than about 10 megaOhms. Select device 120 may remain in the off state until a sufficient voltage, e.g., $V_{TH}$, is applied, or a sufficient current is applied, e.g., $I_{TH}$, that may switch select device 120 to a conductive, relatively low resistance on state. After a voltage potential of greater than about $V_{TH}$ is applied across select device 120, the voltage potential across select device 120 may drop ("snapback") to a holding voltage potential, labeled $V_H$. Snapback may refer to the voltage difference between $V_{TH}$ and $V_H$ of a select device.

In the on state, the voltage potential across select device 120 may remain close to the holding voltage of $V_H$ as current passing through select device 120 is increased. Select device 120 may remain on until the current through select device 120 drops below a holding current, labeled $I_H$. Below this value, select device 120 may turn off and return to a relatively high resistance, nonconductive off state until the $V_{TH}$ and $I_{TH}$ are exceeded again.

Figure 3:
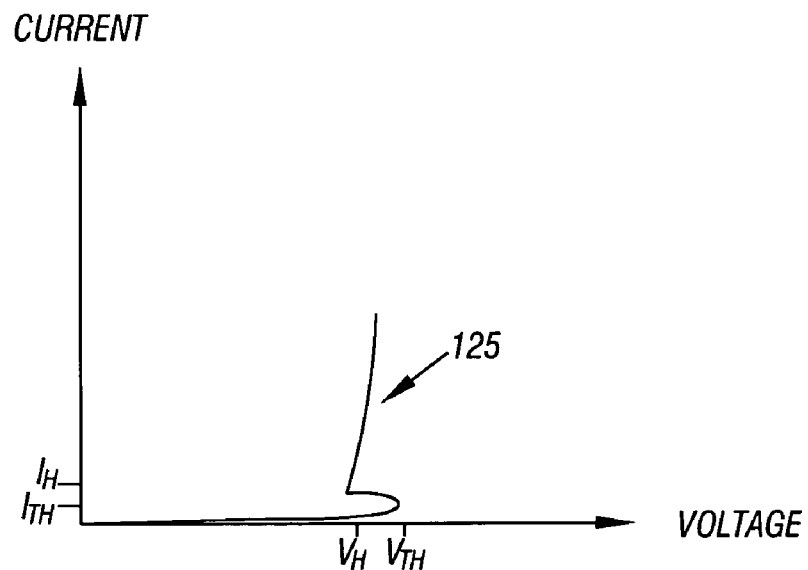
FIG. 3 is a diagram illustrating a current-voltage characteristic of a combination access device.

In one embodiment, the device 120 (FIG. 2) may have a higher resistance and a higher threshold voltage ($V_{TH}$) than the device 125 (FIG. 3). The device 120 may also have a higher activation energy. The threshold and holding voltages of the device 125 may be substantially equal and, in one embodiment, the snapback voltage is less than 0.25 volts. The device 125 may have higher leakage than the device 120 and may have a $V_{TH}$ substantially equal to or less than its $V_H$. If the $V_{TH}$ is less than $V_H$, snapback voltage is minimized. Preferably, $V_H$ of device 125 is greater than snapback voltage of device 120. When both devices 120 and 125 are switched on, the $V_H$ of the two devices in series is equal to the sum of the hold voltage across each device when both devices are on. The combined devices 120, 125 may have a $V_H$ comparable to the snapback of the device 120. Then, by adjusting the threshold current of device 120 to be considerably less than the threshold current of device 125, the voltage across device 125 may be minimized at the time that device 120 triggers, which will minimize snapback voltage. If $V_H$ of device 125 is greater than the snapback voltage of the device 120 and about equal to threshold voltage of device 125, then the devices 120 and 125 will operate together with little snapback voltage when the combination is switched from off to on upon application of current greater than the higher threshold current of the pair, which may be the threshold current device 125, in some embodiments. In one embodiment, the resistance of device 120 may be ten times that of device 125 at the time that device 120 switches on, so most of the voltage drop is across 120.

Figure 4:
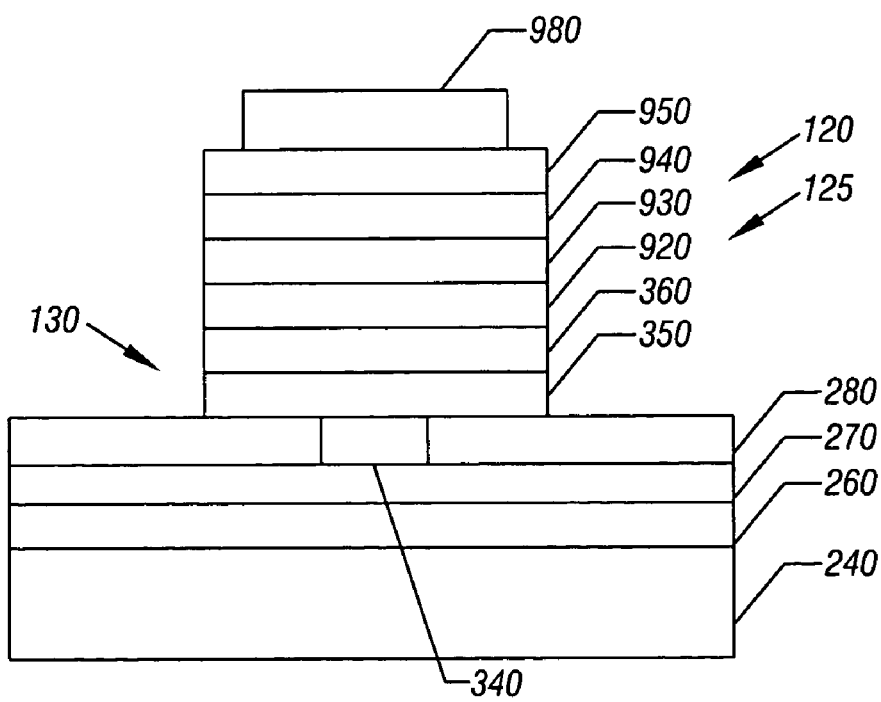
FIG. 4 is a cross-sectional view of a portion of the memory illustrated in FIG. 1 in accordance with an embodiment of the present invention.

Turning to FIG. 4, an embodiment of a memory cell (e.g., 115) of memory 100 is arranged in a vertical stack in one embodiment of the present invention. However, other configurations may also be used including configurations in which the order of the devices is changed, and including configurations with two or three discrete stacks wired in series. Memory cell 115 may comprise substrate 240, insulating material 260 overlying substrate 240, and conductive material 270 overlying insulating material 260. Conductive material 270 may be an address line (e.g., row line 152). Above conductive material 270, electrode 340 may be formed between portions of insulating material 280. Over electrode 340, sequential layers of a memory material 350, electrode material 360, a switching material 920, such as a non-programmable chalcogenide with a lower threshold current and higher threshold voltage relative to its $V_H$, an electrode material 930, a switching material 940, such as a non-programmable chalcogenide with a higher threshold current and lower threshold voltage about equal to $V_H$, an electrode material 950, and a conductive material 980 may be deposited to form a vertical memory cell structure. Conductive material 980 may be an address line (e.g., column line 142).

A substrate 240 may be, for example, a semiconductor substrate (e.g., a silicon substrate), although the scope of the present invention is not limited in this respect. Other suitable substrates may be, but are not limited to, substrates that contain ceramic material, organic material, or a glass material.

A layer of insulating material 260 may be formed over and contacting substrate 240. Insulating material 260 may be a dielectric material that may be a thermally and/or electrically insulating material such as, for example, silicon dioxide, although the scope of the present invention is not limited in this respect. Insulating material 260 may have a thickness ranging from about 300 Å to about 10,000 Å, although the scope of the present invention is not limited in this respect. Insulating material 260 may be planarized using a chemical or chemical-mechanical polish (CMP) technique.

A thin film of a conductive material 270 may be formed overlying insulating material 270 using, for example, a PVD process. Conductive material 270 may be patterned using photolithographic and etch techniques to form a small width in the y-direction (orthogonal to the view shown in FIG. 4). The film thickness of conductive material 270 may range from about 20 Å to about 2000 Å. In one embodiment, the thickness of conductive material 270 may range from about 200 Å to about 1000 Å. In another embodiment, the thickness of conductive material 270 may be about 500 Å.

Conductive material 270 may be an address line of memory 100 (e.g., row line 151, 152, or 153). Conductive material 270 may be, for example, a tungsten (W) film, a doped polycrystalline silicon film, a Ti film, a TiN film, a TiW film, an aluminum (Al) film, a copper (Cu) film, or some combination of these films. In one embodiment, conductive material 270 may be a polycrystalline silicon film with a resistance lowering strap of a refractory silicide on its top surface, although the scope of the present invention is not limited in this respect.

An insulating material 280 may be formed overlying conductive material 270 using, for example, a PECVD (Plasma Enhanced Chemical Vapor Deposition) process, HDP (High Density Plasma) process, or spin-on and bake sol gel process. Insulating material 280 may be a dielectric material that may be a thermally and/or electrically insulating material such as, for example, silicon dioxide, although the scope of the present invention is not limited in this respect. Insulating material 280 may have a thickness ranging from about 100 Å to about 4000 Å, although the scope of the present invention is not limited in this respect. In one embodiment, the thickness of insulating material 280 may range from about 500 Å to about 2500 Å. In another embodiment, the thickness of insulating material 280 may be about 1200 Å.

Although the scope of the present invention is limited in this respect, insulating material 280 may be planarized using a chemical or CMP technique. The resulting thickness of insulating material 280 may range from about 20 Å to about 4000 Å. In one embodiment, after planarizing insulating material 280, the thickness of insulating material 280 may range from about 200 Å to about 2000 Å. In another embodiment, the thickness of insulating material 280 may be about 900 Å.

Memory material 350 may be a phase change, programmable material capable of being programmed into one of at least two memory states by applying a current to memory material 350 to alter the phase of memory material 350 between a substantially crystalline state and a substantially amorphous state, wherein a resistance of memory material 350 in the substantially amorphous state is greater than the resistance of memory material 350 in the substantially crystalline state.

Programming of memory material 350 to alter the state or phase of the material may be accomplished by applying voltage potentials to conductive materials 340 and 980, thereby generating a voltage potential across select devices 120, 125 and memory element 130. When the voltage potential is greater than the threshold voltages of select devices 120, 125 and memory element 130, then an electrical current may flow through memory material 350 in response to the applied voltage potentials, and may result in heating of memory material 350.

This heating may alter the memory state or phase of memory material 350. Altering the phase or state of memory material 350 may alter the electrical characteristic of memory material 350, e.g., the resistance of the material may be altered by altering the phase of the memory material 350. Memory material 350 may also be referred to as a programmable resistive material.

In the "reset" state, memory material 350 may be in an amorphous or semi-amorphous state and in the "set" state, memory material 350 may be in an a crystalline or semi-crystalline state. The resistance of memory material 350 in the amorphous or semi-amorphous state may be greater than the resistance of memory material 350 in the crystalline or semi-crystalline state. It is to be appreciated that the association of reset and set with amorphous and crystalline states, respectively, is a convention and that at least an opposite convention may be adopted.

Using electrical current, memory material 350 may be heated to a relatively higher temperature to amorphosize memory material 350 and "reset" memory material 350 (e.g., program memory material 350 to a logic "0" value). Heating the volume of memory material 350 to a relatively lower crystallization temperature may crystallize memory material 350 and "set" memory material 350 (e.g., program memory material 350 to a logic "1" value). Various resistances of memory material 350 may be achieved to store information by varying the amount of current flow and duration through the volume of memory material 350.

Select device 125 may include a bottom electrode 360 and a switching material 920 overlying bottom electrode 360 as shown in FIG. 4. In other words, switching material 920 may be formed over and contacting bottom electrode 360. In addition, select device 125 may include a top electrode 930 overlying switching material 920.

Although the scope of the present invention is not limited in this respect, bottom electrode 360 may be a thin film material having a film thickness ranging from about 20 Angstroms (Å) to about 2000 Å. In one embodiment, the thickness of electrode 360 may range from about 100 Å to about 1000 Å. In another embodiment, the thickness of electrode 360 may be about 300 Å. Suitable materials for bottom electrode 360 may include a thin film of titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with switching material 940.

Although the scope of the present invention is not limited in this respect, switching material 920 may be a thin film material having a thickness ranging from about 20 Å to about 2000 Å. In one embodiment, the thickness of switching material 920 may range from about 200 Å to about 1000 Å. In another embodiment, the thickness of switching material 920 may be about 500 Å.

Switching material 920 may be formed overlying bottom electrode 360 using a thin film deposition technique such as, for example, a chemical vapor deposition (CVD) process or a physical vapor deposition (PVD). Switching material 920 may be a thin film of a chalcogenide material or an ovonic material in a substantially amorphous state that may be repeatedly and reversibly switched between a higher resistance "off" state and a relatively lower resistance "on" state by application of a predetermined electrical current or voltage potential. Switching material 920 may be a nonprogammable material.

Although the scope of the present invention is not limited in this respect, in one example, the composition of switching material 920 may comprise a Si concentration of about 14%, a Te concentration of about 39%, an As concentration of about 37%, a Ge concentration of about 9%, and an In concentration of about 1%. In another example, the composition of switching material 940 may comprise a Si concentration of about 14%, a Te concentration of about 39%, an As concentration of about 37%, a Ge concentration of about 9%, and a P concentration of about 1%. In these examples, the percentages are atomic percentages which total 100% of the atoms of the constituent elements.

In another embodiment, a composition for switching material 920 may include an alloy of arsenic (As), tellurium (Te), sulfur (S), germanium (Ge), selenium (Se), and antimony (Sb) with respective atomic percentages of 10%, 21%, 2%, 15%, 50%, and 2%.

Although the scope of the present invention is not limited in this respect, in other embodiments, switching material 920 may include Si, Te, As, Ge, sulfur (S), and selenium (Se). As an example, the composition of switching material 940 may comprise a Si concentration of about 5%, a Te concentration of about 34%, an As concentration of about 28%, a Ge concentration of about 11%, a S concentration of about 21%, and a Se concentration of about 1%.

Top electrode 930 may be a thin film material having a thickness ranging from about 20 Å to about 2000 Å. In one embodiment, the thickness of electrode 930 may range from about 100 Å to about 1000 Å. In another embodiment, the thickness of electrode 930 may be about 300 Å. Suitable materials for top electrode 230 may include a thin film of titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with switching material 920.

In one embodiment, top electrode and bottom electrode may comprise carbon and may have a thickness of about 500 Å. Top electrode 930 may also be referred to as an upper electrode and bottom electrode 360 may also be referred to as a lower electrode. In this embodiment, select device 125 may be referred to as a vertical structure since electrical current may flow vertically through switching material 920 between top electrode 930 and bottom electrode 360. Select device 125 may be referred to as a thin film select device if thin films are used for switching material 920 and electrodes 930 and 360.

The threshold current ($I_{TH}$) of select device 125 may be less than the threshold current for an ovonic memory device set in a high resistance, amorphous state. The resistance of the select devices 120, 125 at the time that the select devices switch on may be much greater, such as ten times greater, than the resistance of the memory element 130, so that when a select device 120 or 125 is switched on, most of the voltage is across the select device to minimize variation in the voltage at which the select device switches. The threshold voltage ($V_{TH}$) of select device 125 may be altered by changing process variables such as, for example, the thickness or alloy composition of switching material 920 and the active area of the contacting electrode. For example, increasing the thickness of switching material 920 may increase the threshold voltage of select device 125, with the result that the snapback voltage is increased if $V_H$ of the device remains the same. The holding voltage ($V_H$) of select device 125 may be altered or set by the type of contact to switching device 125, e.g., the composition of electrodes 360 and 930 may determine the holding voltage of select device 125.

Switching material 940 and electrodes 930 and 950 may form select device 120. Switching material 940 may be formed using similar but different materials and similar but different manufacturing techniques used to form switching material 920 described herein. Switching materials 920 and 940 may be composed of different materials. For example, in one embodiment, switching material 920 may be composed of a chalcogenide material and switching material 940 may be composed of a different chalcogenide material.

The threshold voltage of a select device 120 or 125 may be determined by the thickness or alloy composition of the switching material of the ovonic switch and the holding voltage of an ovonic switch may be determined by the composition of the electrodes contacting the switching material of the ovonic switch. Accordingly, in one embodiment, the snapback voltage of the device 125 may be reduced by reducing the thickness of the switching material and using a particular type of electrode.

In one embodiment, the switching material 920 may be thinner than the thickness of switching material 940 to reduce leakage. Alternatively, the material 920 may be made of a lower leakage alloy such as an allow with a higher semiconductor bandgap in the range of 0.8 eV to 1.0 eV, such as an As, Se, Ge alloy with 20% to 40% Ge. One suitable alloy includes (in atomic percentages) 10% As, 21% Te, 2% S, 15% Ge, 50% Se and 2% Sb, with a bandgap of about 0.85 eV. As another example, the switching element 920 may have a smaller area measured in the horizontal direction to reduce leakage.

The device 125 may be made using a different alloy as the switching material 940 (e.g., Te 39%, As 37%, Si 17%, Ge 7%), with 10 to 20% added silicon in one embodiment. The alloy for the material 940 may be a higher leakage alloy.

In this embodiment, the threshold voltage of select device 120 may be about 3 volts and the holding voltage of select device 120 may be about one volt. The threshold voltage of select device 125 may be about 1.1 or less volts and the holding voltage of select device 125 may be about one volt. The threshold voltage of the device 130 may be less than the snapback voltage of the series combination of devices 120 and 125, so that $V_{TH}$ of the memory device 130 is not exceeded when the select device snaps back. To further reduce the snapback voltage, more than one device like the device of 125 may be placed in series with the device of 120. As still another option, the device 120 may be made of a material with a higher activation energy. In some embodiments, the device 120 may be formed of a chalcogenide having a higher glass transition temperature.

Further, the leakage and the threshold current of the device 120 may be less than the leakage of the device 125 and the memory element 130 so that, until the device 120 triggers (as its voltage exceeds its threshold voltage), the voltage across the device 125 and the element 130 may be minimized to a relatively insignificant voltage, and the leakage into the series combination minimized when deselected. In one embodiment, that voltage across device 130 may be less than 10% of the voltage across the device 120 until it is triggered. For example, the resistance across the device 125 and the element 130 can be ten times less than the resistance across the device 120 until the device 120 triggers by exceeding its threshold voltage. The increase in threshold voltage for the combined series set of the devices is a resistor divider across the device 120. That is, the increase, relative to the total voltage across selected row and column voltage, that is across device 120 is proportionate to the voltage dropped across the device 125 and the element 130, which can be reduced by increasing the leakage and decreasing the resistance of the device 125 relative to device 120 at the time device 120 switches on. Maintaining the series devices 120 and 125 in the $V_H$ on state is assured by maintaining the current greater than $I_H$ of both after they switch on, and the holding current and threshold currents ($I_{TH}$) of the select device 120 or 125 ($I_{TH}$) may be adjusted to be less than the ITH current of memory element 130.

For example, if the device 120 triggers at 3.3 volts across the select devices 120 and 125 and memory element 130 to a holding voltage of one volt, this leaves 2.3 volts across the remaining device 125 and a memory element 130. The 2.3 volts is adequate to trigger device 125, and the relative resistances of device 125 and 130 may be such that most of the voltage is across the device 125 so only it switches, leaving the memory element 130 unswitched with the balance of the voltage across it (above voltage device 120+$V_H$ device 125) so that the holding voltage of the device 125 is added to the holding voltage of the device 120, with the balance of the voltage across the memory element 130. The resulting snapback voltage of the combination of devices 120 and 130 is 3.3 V minus $V_H$ of device 120 minus $V_H$ of device 125 minus the voltage across element 130, say 1.3V. This voltage can be further reduced by increasing the holding voltage of any of the devices or by reducing the threshold voltage of any of the devices 120 or 125 or by adding addition devices 125 to the series combination.

After the devices 120 and 125 trigger, the balance of the voltage developed on the bitline, above the row line, is then across the memory element 130. As the voltage increases when the column line is driven by a current source, the voltage can be read as a one when the element 130 is reset because the column line voltage keeps increasing and exceeds the sensor or reference voltage. If, after a reasonable period of time, the column line does not exceed the reference voltage, then the bit is set and in the lower resistance state.

For a combined select device and memory element that has no snapback, the total voltage across the combined devices 120 and 125 increases as the increasing current is forced into the pair. If the threshold voltage of the device 120 is equal to the holding voltage of the device 120 plus the holding voltage of the device 125, and the threshold voltage of the device 125 equals the holding voltage of the device 125, then the snapback voltage of the device 120 is absorbed in the increase of voltage across the device 125 without the device 130 thresholding, then the selection devices in series appear to have no snapback voltage in combination. To absorb the snapback voltage of the first device, the threshold voltage of the device 120, minus the holding voltage of the device 120, must be less than the threshold voltage of 125, which is preferably less than holding voltage of the device 125.

As an example, if the threshold voltage of the device 125 equals the holding voltage of the device 125, which in this example is 1.5 volts, and the threshold voltage of the device 120 is 2.6 volts with a holding voltage of 1.5 volts, then the voltage across the device 125 at the threshold of the device 120 is equal to 0.4. The resistance of the device 125 at a threshold current of the device 120 flowing through it may be about 10% of the resistance of the device 120 at its threshold voltage. So immediately prior to the device 120 thresholding, the voltage across the device 120 is 2.6 volts, the voltage across the device 125 is 0.3 volts and the total voltage is 2.9 volts.

After the device 120 thresholds, the voltage across the device 120 is equal to the holding voltage of the device 120 or 1.5 volts, while the voltage across the device 125 is 1.4 volts, which is still below both the threshold voltage and the holding voltage of the memory element. The total voltage then is 2.9 volts without snapbacks since an additional 0.1 volt needs to be applied across the device 125 before it snaps back.

As still another example, the device 125 may have a threshold voltage equal to its holding voltage which is 1.5 volts and the threshold voltage of the device 120 can be 2.6 volts with a holding voltage of 1.5 volts. Then, immediately prior to the device 120 thresholding, the device 120 has 2.6 volts across it, the device 125 has 0.7 volts across it, for a total of 3.3 volts, and memory element 130 has 0.2V, for a total of 3.5V between row and column lines. After thresholding of the device 120, the device 120 has a $V_H$ of 1.5 volts, device 125 has a $V_H$ of 1.5V, and the memory element 130 has increased to 0.5 volts, so there a 0.2 volt snapback since the memory element 130 now sees this increase in voltage across it without an increase from row to column voltage.

Thus, the voltage across the memory element 130 to switch also determines the amount of snapback and this is determined by the relative resistances when the device 120 switches. However, even though the thicker device 120 can be viewed as having a higher resistance and, hence, the most voltage drop, at the time immediately prior to its thresholding, it has a full threshold voltage across it, whereas the device 125 only has a fraction of its threshold voltage across it. The amount of snapback voltage for the combined devices 120 and 125 is then developed across the element 130 and results in current flow that may exceed the holding current of the devices 120 and 125 so that stable voltages are established and maintained as the current increases in the element 130.

Thus, in some embodiments, lower leakage is preferred in the device 120. The increased snapback contributed by the device 120 is counteracted by the device 125. In some embodiments, the combination of devices 120 and 125 result in lower leakage and less snapback when the series combination is used as the select device for memory element 130.

Figure 5:
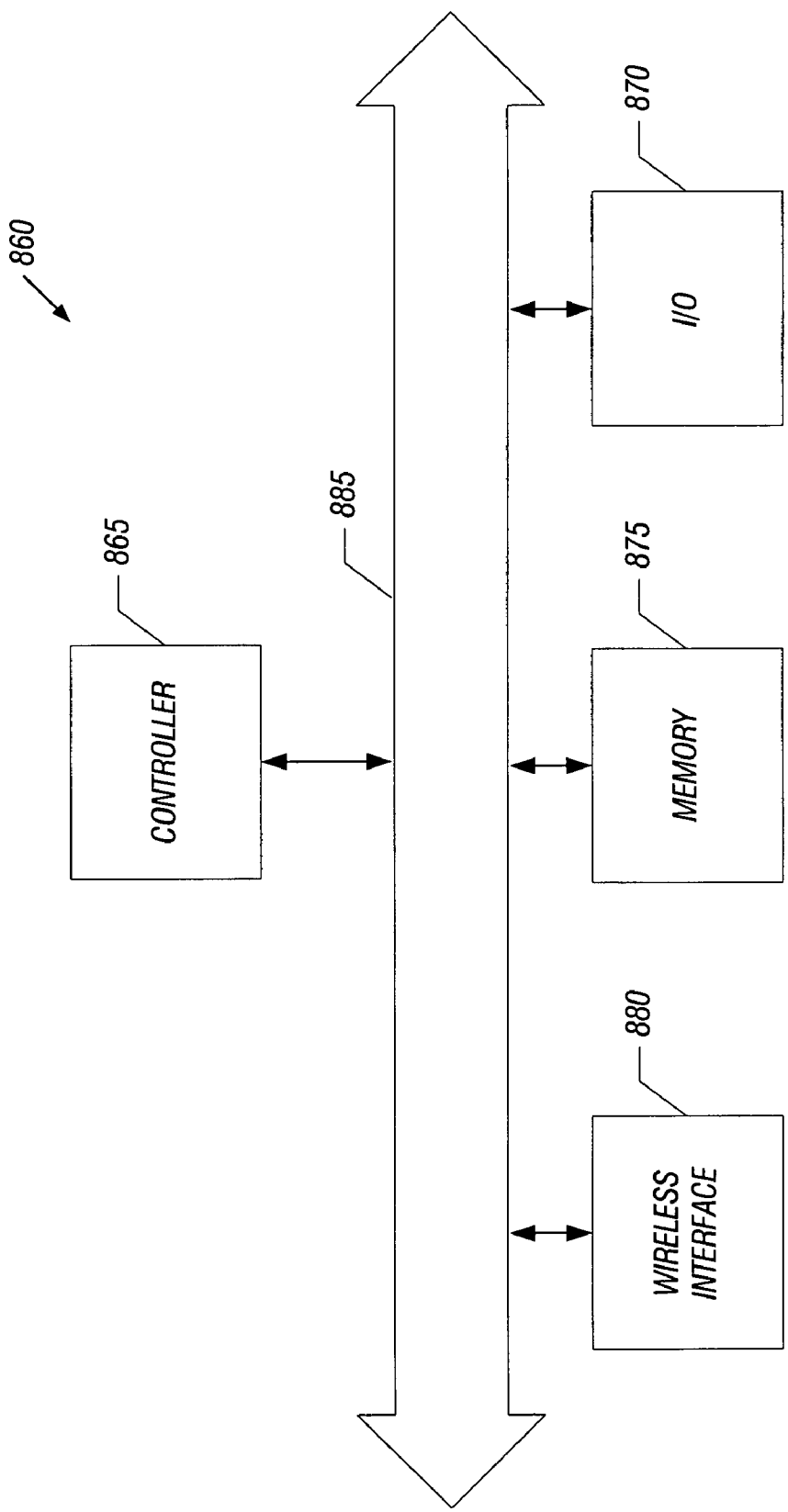
FIG. 5 is a block diagram illustrating a portion of a system in accordance with an embodiment of the present invention.

Turning to FIG. 5, a portion of a system 860 in accordance with an embodiment of the present invention is described. System 860 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 860 may be used in any of the following systems: a wireless local area network (WLAN) system, a wireless personal area network (WPAN) system, a cellular network, although the scope of the present invention is not limited in this respect.

System 860 may include a controller 865, an input/output (I/O) device 870 (e.g. a keypad, display), a memory 875, and a wireless interface 880 coupled to each other via a bus 885. It should be noted that the scope of the present invention is not limited to embodiments having any or all of these components.

Controller 865 may comprise, for example, one or more microprocessors, digital signal processors, microcontrollers, or the like. Memory 875 may be used to store messages transmitted to or by system 860. Memory 875 may also optionally be used to store instructions that are executed by controller 865 during the operation of system 860, and may be used to store user data. Memory 875 may be provided by one or more different types of memory. For example, memory 875 may comprise any type of random access memory, a volatile memory, a non-volatile memory such as a flash memory and/or a memory such as memory 100 discussed herein.

I/O device 870 may be used by a user to generate a message. System 860 may use wireless interface 880 to transmit and receive messages to and from a wireless communication network with a radio frequency (RF) signal. Examples of wireless interface 880 may include an antenna or a wireless transceiver, although the scope of the present invention is not limited in this respect.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. An apparatus, comprising:
   a phase change memory element;
   a series connected first selection device; and
   a series connected second selection device having higher resistance and a larger threshold voltage than said first selection device.

2. The apparatus of claim 1 wherein the holding voltage and threshold voltage of said first selection device are substantially equal.

3. The apparatus of claim 1 wherein the snapback voltage of the first selection device is less than 0.25 volts.

4. The apparatus of claim 1 wherein the second selection device has a higher activation energy than said first selection device.

5. The apparatus of claim 1 wherein said element and said devices are arranged in a vertical stack.

6. The apparatus of claim 5 wherein said devices and said element include a chalcogenide.

7. The apparatus of claim 6 wherein said second selection device has a larger snapback voltage than said first selection device.

8. The apparatus of claim 6 wherein the chalcogenide in said first and second selection devices is a nonprogrammable material.

9. A method comprising:
coupling a first selection device and a second selection device in series with a phase change memory element such that the first selection device has a higher resistance and a larger threshold voltage than said second selection device.

10. The method of claim 9 including coupling a second selection device having a holding voltage and a threshold voltage that are substantially equal.

11. The method of claim 9 including coupling a first selection device having a snapback voltage less than 0.25 volts.

12. The method of claim 9 including using a first selection device having a higher activation energy than said second selection device.

13. The method of claim 9 including stacking said memory element, said first selection device and said second selection device in a vertical stack.

14. The method of claim 13 including forming said devices of chalcogenide.

15. The method of claim 14 including providing the first selection device with a larger snapback than said second selection device.

16. The method of claim 15 including using a chalcogenide that is non-programmable in said first and second selection devices.

17. The method of claim 9 including using said second selection device to reduce the snapback contributed by the first selection device.

18. The method of claim 17 including using the first selection device to reduce the leakage of said series connected selection devices and memory element.

19. A system, comprising:
a processor;
a wireless interface coupled to the processor; and
a memory coupled to the processor, the memory including:
a phase change memory element;
a series connected first selection device; and
a series connected second selection device having higher resistance and a larger threshold voltage than said first selection device.

20. The system of claim 19 wherein the holding voltage and threshold voltage of said first selection device are substantially equal.

21. The system of claim 19 wherein the snapback voltage of the first selection device is less than 0.25 volts.

22. The system of claim 19 wherein the second selection device has a higher activation energy than said first selection device.

23. The system of claim 19 wherein said element and said devices are arranged in a vertical stack.

24. The system of claim 23 wherein said devices and said element include a chalcogenide.

25. The system of claim 24 wherein said second selection device has a larger snapback voltage than said first selection device.

26. The system of claim 24 wherein the chalcogenide in said first and second selection devices is a nonprogrammable material.

* * * * *